(12) United States Patent
Yokota et al.

(10) Patent No.: US 9,688,884 B2
(45) Date of Patent: Jun. 27, 2017

(54) POLISHING COMPOSITION

(71) Applicant: FUJIMI INCORPORATED, Kiyosu-shi, Aichi (JP)

(72) Inventors: Shuugo Yokota, Kiyosu (JP); Yasuyuki Yamato, Kiyosu (JP); Satoru Yarita, Kiyosu (JP); Tomohiko Akatsuka, Kiyosu (JP); Shuichi Tamada, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/359,252

(22) PCT Filed: Nov. 21, 2012

(86) PCT No.: PCT/JP2012/080218
§ 371 (c)(1),
(2) Date: May 19, 2014

(87) PCT Pub. No.: WO2013/077368
PCT Pub. Date: May 30, 2013

(65) Prior Publication Data
US 2014/0342562 A1    Nov. 20, 2014

(30) Foreign Application Priority Data

Nov. 25, 2011  (JP) .................................. 2011-258342
Mar. 16, 2012  (JP) .................................. 2012-061155

(51) Int. Cl.
*C09K 13/00*     (2006.01)
*C09G 1/02*      (2006.01)
(Continued)

(52) U.S. Cl.
CPC .............. *C09G 1/02* (2013.01); *B24B 37/044* (2013.01); *C09K 3/1409* (2013.01);
(Continued)

(58) Field of Classification Search
CPC ...... C09K 3/1409; C09K 3/1463; C09G 1/02; B24B 37/044; H01L 21/30625; H01L 21/02024
(Continued)

(56) References Cited

U.S. PATENT DOCUMENTS 6,398,827 B1 *  6/2002  Ota et al. .......................... 51/308
6,740,590 B1 *  5/2004  Yano et al. ..................... 438/692
(Continued)

FOREIGN PATENT DOCUMENTS

JP    63-150155 A    6/1988
JP    2000-160140 A    6/2000
(Continued)

OTHER PUBLICATIONS

Standard Reduction Potential, via http://www.colby.edu/chemistry/CH142/CH142B/StandardReductionPotentials.pdf ; 1 page; No date available.*

*Primary Examiner* — Binh X Tran
(74) *Attorney, Agent, or Firm* — Foley & Lardner LLP

(57) ABSTRACT

A polishing composition of the present invention is to be used for polishing an object including a portion containing a high-mobility material and a portion containing a silicon material. The polishing composition comprises odd-shaped abrasive grains and an oxidizing agent having a standard electrode of 0.3 V or more, and preferably further contains a salt, such as an ammonium salt. The pH of the polishing composition is 1 or more and 6 or less, or 8 or more and 14 or less. The average degree of association of the abrasive grains, obtained by dividing the value of the average secondary particle diameter of the abrasive grains by the value of the average primary particle diameter of the abrasive grains, is preferably 1.6 or more.

17 Claims, 1 Drawing Sheet

(51) Int. Cl.
*H01L 21/306* (2006.01)
*B24B 37/04* (2012.01)
*C09K 3/14* (2006.01)
*H01L 21/3105* (2006.01)
*H01L 21/8258* (2006.01)

(52) U.S. Cl.
CPC .. *H01L 21/30625* (2013.01); *H01L 21/31053* (2013.01); *H01L 21/8258* (2013.01)

(58) Field of Classification Search
USPC .................. 438/692, 639, 693; 252/79.1
See application file for complete search history.

(56) References Cited

U.S. PATENT DOCUMENTS

| | | | |
|---|---|---|---|
| 6,995,090 B2 | 2/2006 | Minamihaba et al. | |
| 7,507,668 B2 | 3/2009 | Ishibashi et al. | |
| 8,338,302 B2 | 12/2012 | Schwandner et al. | |
| 9,028,574 B2 * | 5/2015 | Ashitaka | C09K 3/1409 51/308 |
| 2003/0124850 A1 | 7/2003 | Minamihaba et al. | |
| 2005/0205836 A1 * | 9/2005 | Yoshizawa et al. | 252/79.1 |
| 2006/0175295 A1 * | 8/2006 | Chu et al. | 216/88 |
| 2007/0074457 A1 | 4/2007 | Ito et al. | |
| 2007/0075041 A1 | 4/2007 | Ishibashi et al. | |
| 2008/0200033 A1 | 8/2008 | Takemiya | |
| 2009/0001339 A1 | 1/2009 | Lee et al. | |
| 2009/0159845 A1 | 6/2009 | Ishibashi et al. | |
| 2010/0130012 A1 | 5/2010 | Schwandner et al. | |
| 2010/0164106 A1 * | 7/2010 | Lee | H01L 21/7684 257/751 |
| 2011/0081780 A1 * | 4/2011 | Shida | C09G 1/02 438/693 |
| 2011/0117740 A1 | 5/2011 | Martinez et al. | |
| 2011/0209413 A1 * | 9/2011 | Nishida | C01B 33/14 51/308 |
| 2012/0164833 A1 | 6/2012 | Ishibashi et al. | |

FOREIGN PATENT DOCUMENTS

| | | | | |
|---|---|---|---|---|
| JP | 2003-109918 A | 4/2003 | | |
| JP | 2003-133267 A | 5/2003 | | |
| JP | 2003-197574 A | 7/2003 | | |
| JP | 2004-207417 A | 7/2004 | | |
| JP | 2004-327614 A | 11/2004 | | |
| JP | 2007-005562 A | 1/2007 | | |
| JP | 2007-103463 A | 4/2007 | | |
| JP | 2007-103514 A | 4/2007 | | |
| JP | 4053755 B2 | 2/2008 | | |
| JP | 2009-016821 A | 1/2009 | | |
| JP | 2010-092968 A | 4/2010 | | |
| JP | WO 2010052945 A1 * | 5/2010 | | C01B 33/14 |
| JP | 2010-130009 A | 6/2010 | | |
| JP | 2010-519740 A | 6/2010 | | |
| JP | 2011-238763 A | 11/2011 | | |
| WO | WO-2007/029465 A1 | 3/2007 | | |
| WO | WO 2008/099245 A1 | 8/2008 | | |

* cited by examiner

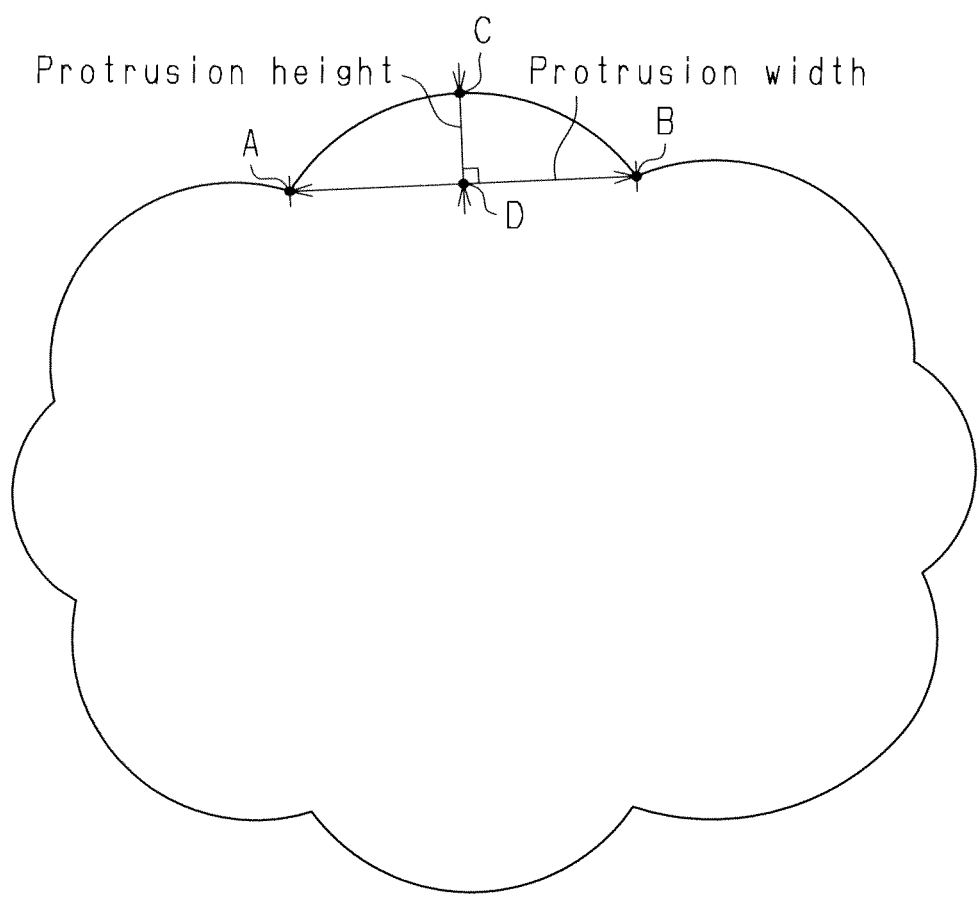

POLISHING COMPOSITION

TECHNICAL FIELD

The present invention relates to a polishing composition to be used for polishing an object including a portion containing a high-mobility material (hereinafter, also referred to as a high-mobility material portion), such as a group IV material and a group III-V compound, and a portion containing a silicon material (hereinafter, also referred to as a silicon material portion), such as silicon oxide. The present invention also relates to a polishing method and substrate production method using the polishing composition.

BACKGROUND ART

Group III-V compounds, such as gallium arsenide (GaAs), and group IV materials, such as silicon germanium (SiGe) and germanium (Ge), have higher electron and hole mobility than that of silicon and an excellent carrier transport property, and are expected as next-generation semiconductor high-mobility channel materials.

A channel using a high-mobility material can be formed by polishing an object including a high-mobility material portion and a silicon material portion. In this case, when a polishing composition is used that can non-selectively polish and remove the high-mobility material portion and the silicon material portion, the high-mobility material portion and the silicon material portion can be simultaneously polished. The non-selective polishing of the high-mobility material portion and the silicon material portion enables a desired pattern shape to be formed in a suitable manner without producing a level difference between the high-mobility material portion and the silicon material portion. However, both a polishing composition conventionally used for polishing a group IV compound semiconductor substrate and described in, for example, Patent Document 1 or 2, and a polishing composition conventionally used for polishing a group III-V compound semiconductor substrate and described in, for example, Patent Document 3 or 4 are inferior in the capability of efficiently and non-selectively polishing and removing a high-mobility material portion and a silicon material portion. Those conventional polishing compositions are thus unsuitable for the purpose of simultaneously polishing a high-mobility material portion and a silicon material portion.

PRIOR ART DOCUMENTS

Patent Document 1: Japanese Laid-Open Patent Publication No. 2010-130009
Patent Document 2: Japanese National Phase Laid-Open Patent Publication No. 2010-519740
Patent Document 3: Japanese Laid-Open Patent Publication No. 63-150155
Patent Document 4: Japanese Laid-Open Patent Publication No. 2004-327614

SUMMARY OF THE INVENTION

Problems that the Invention is to Solve

Accordingly, it is an objective of the present invention to provide a polishing composition suitable for the purpose of simultaneously polishing a high-mobility material portion and a silicon material portion, and a polishing method and substrate production method using the polishing composition.

Means for Solving the Problems

The present inventors have completed the present invention based on a finding that when a high-mobility material portion and a silicon material portion, which have chemical characteristics significantly different from each other, are simultaneously polished, the high-mobility material portion and the silicon portion can be non-selectively and effectively polished and removed if a mechanical action by abrasive grains or the like rather than a chemical action by an additive in a polishing composition is made into the rate determining factor for effects on the object to be polished.

That is, in order to achieve the above-mentioned objective and in accordance with a first aspect of the present invention, provided is a polishing composition to be used for polishing an object including a high-mobility material portion and a silicon material portion. The polishing composition contains odd-shaped abrasive grains and an oxidizing agent having a standard electrode of 0.3 V or more, and has a pH of 1 or more and 6 or less, or 8 or more and 14 or less.

The abrasive grains have an average degree of association, obtained by dividing an average secondary particle diameter value of the abrasive grains by an average primary particle diameter value of the abrasive grains, is preferably 1.6 or more.

The abrasive grains may each have a surface with protrusions, which are referred to as spiky-shaped particles. In that case, part of the particles has larger particle diameters than the volume average particle diameter of the particles, and the average of values respectively obtained by dividing the height of a protrusion on the surface of each particle belonging to the part of the particles by the width of a base portion of the same protrusion is preferably 0.245 or more.

Protrusions on the surfaces of particles which belong to the part of the particles each having the surface with the plurality of protrusions and have larger particle diameters than the volume average particle diameter of the particles have an average height of preferably 2.5 nm or more.

The polishing composition of the first aspect may further contain a salt. The salt is preferably an ammonium salt.

In accordance with a second aspect of the present invention, provided is a method for polishing an object including a high-mobility material portion and a silicon material portion with the polishing composition of the first aspect.

In accordance with a third aspect of the present invention, provided is a method for producing a substrate by polishing an object including a high-mobility material portion and a silicon material portion with the polishing composition of the first aspect.

Effects of the Invention

The present invention succeeds in providing a polishing composition suitable for the purpose of simultaneously polishing a high-mobility material portion and a silicon material portion, and a polishing method and substrate production method using the polishing composition.

BRIEF DESCRIPTION OF THE DRAWINGS

FIG. 1 is a diagram showing a projected contour of an outer shape of a particle that has a surface with protrusions and can be used as an abrasive grain contained in a polishing composition according to an embodiment of the present invention.

MODES FOR CARRYING OUT THE INVENTION

One embodiment of the present invention will be described below.

A polishing composition of the present embodiment is prepared by mixing specific abrasive grains and a specific oxidizing agent with water. The polishing composition has a pH adjusted to the range of 1 or more and 6 or less, or 8 or more and 14 or less by adding a pH adjusting agent as required. Accordingly, the polishing composition contains specific abrasive grains and a specific oxidizing agent, and further contains a pH adjusting agent as required.

The polishing composition is used for polishing an object including a high-mobility material portion and a silicon material portion, and specifically for the purpose of simultaneously polishing a high-mobility material portion and a silicon material portion in an application for polishing the object to produce a substrate. A high-mobility material as referred to here means a material having higher electron or hole mobility than that of a silicon material. Examples of the high-mobility material include group III-V compounds, such as gallium phosphide (GaP), indium phosphide (InP), gallium arsenide (GaAs), indium arsenide (InAs), and indium antimonide (InSb) and group IV materials, such as silicon germanium (SiGe), germanium (Ge), and silicon carbide (SiC). Examples of the silicon material include polysilicon, silicon oxide, and silicon nitride. For example, the silicon material has an electron mobility of 1,600 $cm^2/V \cdot s$ and a hole mobility of 430 $cm^2/V \cdot s$. By contrast, the high-mobility material, that is, indium phosphide has an electron mobility of 5,400 $cm^2/V \cdot s$ and a hole mobility of 200 $cm^2/V \cdot s$; gallium arsenide has an electron mobility of 8,500 $cm^2/V \cdot s$ and a hole mobility of 400 $cm^2/V \cdot s$; indium arsenide has an electron mobility of 40,000 $cm^2/V \cdot s$ and a hole mobility of 500 $cm^2/V \cdot s$; indium antimonide has an electron mobility of 77,000 $cm^2/V \cdot s$ and a hole mobility of 850 $cm^2/V \cdot s$; and germanium has an electron mobility of 3,900 $cm^2/V \cdot s$ and a hole mobility of 1,900 $cm^2/V \cdot s$. The high-mobility material has at least one of electron mobility and hole mobility values significantly higher than that of the silicon material.

(Abrasive Grains)

The abrasive grains contained in the polishing composition have an odd shape, i.e., a non-spherical shape. When the odd-shaped abrasive grains are used, the polishing rate of the high-mobility material portion and silicon material portion, in particular, the polishing rate of the silicon material portion with the polishing composition is advantageously enhanced as compared with the case where abrasive grains having a non-odd shape, i.e., a spherical shape are used. Typical examples of the odd-shaped abrasive grains include particles each having a constricted central portion, which are referred to as peanut shell-shaped particles, and particles each having a surface with protrusions, which are referred to as spiky-shaped particles.

When the abrasive grains in the polishing composition contain particles each having a surface with protrusions, the average number of protrusions that each particle has on the surface thereof is preferably 3 or more, and more preferably 5 or more.

A protrusion as referred to here has a sufficiently small height and width in comparison to the particle diameter of an abrasive grain. Further, a protrusion is such that the length of a portion shown in FIG. 1 as a curve AB which passes through a point A and a point B does not exceed one-fourth of the circumferential length of the maximum inscribed circle of an abrasive grain particle, or more accurately, the circumferential length of the maximum circle inscribed in a projected contour of the outer shape of the abrasive grain particle. The width of a protrusion refers to a width of a base portion of the protrusion, and is expressed in FIG. 1 as the distance between the point A and the point B. The height of a protrusion refers to a distance between the base portion of the protrusion and a portion of the protrusion furthest from the base portion, and is expressed in FIG. 1 as the length of a segment CD which is orthogonal to a straight line AB.

When the abrasive grains in the polishing composition contain particles each having a surface with protrusions, part of the particles has larger particle diameters than the volume average particle diameter of the particles, and the average of values respectively obtained by dividing the height of a protrusion on the surface of each particle belonging to the part of the particles by the width of a base portion of the same protrusion is preferably 0.245 or more, and more preferably 0.255 or more. As the average of the above values increases, the polishing rate of the high-mobility material portion and silicon material portion, in particular, the polishing rate of the silicon material portion with the polishing composition is enhanced because the shapes of the protrusions are comparatively sharp. The height of each protrusion of an abrasive grain particle and the width of the protrusion at the base portion can be determined by using general image analysis software to analyze an image of the abrasive grain particle taken by a scanning electron microscope.

When the abrasive grains in the polishing composition contain particles each having a surface with protrusions, protrusions on the surfaces of particles which belong to the part of the particles each having the surface with the plurality of protrusions and have larger particle diameters than the volume average particle diameter of the particles have an average height of preferably 2.5 nm or more, more preferably 2.7 nm or more, and still more preferably 3.0 nm or more. As the average height of the protrusions increases, the polishing rate of the high-mobility material portion and silicon material portion, in particular, the polishing rate of the silicon material portion with the polishing composition is enhanced.

The abrasive grains in the polishing composition may be any of inorganic particles and organic particles. Specific examples of inorganic particles include particles made of a metal oxide, such as silica, alumina, ceria, and titania. Specific examples of organic particles include polymethyl methacrylate (PMMA) particles. Among them, silica particles are preferable, and colloidal silica is particularly preferable.

The content of the abrasive grains in the polishing composition is preferably 0.1% by mass or more, more preferably 0.5% by mass or more, and still more preferably 1% by mass or more. As the abrasive grain content increases, the polishing rate of the high-mobility material portion and silicon material portion, in particular, the polishing rate of the silicon material portion with the polishing composition is enhanced.

The content of the abrasive grains in the polishing composition is also preferably 30% by mass or less, more preferably 25% by mass or less, and still more preferably 20% by mass or less. As the abrasive grain content decreases, the material cost of the polishing composition can be reduced, and additionally, the aggregation of the abrasive grains is less likely to occur.

The average primary particle diameter of the abrasive grains is preferably 5 nm or more, more preferably 7 nm or more, and still more preferably 10 nm or more. As the average primary particle diameter of the abrasive grains increases, the polishing rate of the high-mobility material portion and silicon material portion, in particular, the polishing rate of the silicon material portion with the polishing composition is enhanced. The value of the average primary particle diameter of the abrasive grains can be calculated, for example, based on the specific surface area of the abrasive grains measured by the BET method.

The average primary particle diameter of the abrasive grains is also preferably 150 nm or less, more preferably 110 nm or less, and still more preferably 100 nm or less. As the average primary particle diameter of the abrasive grains decreases, a polished surface with fewer scratches is easily obtained by polishing the object with the polishing composition.

The average secondary particle diameter of the abrasive grains is preferably 300 nm or less, more preferably 270 nm or less, and still more preferably 250 nm or less. As the average secondary particle diameter of the abrasive grains decreases, a polished surface with fewer scratches is easily obtained by polishing the object with the polishing composition. The value of the average secondary particle diameter of the abrasive grains can be measured, for example, by a laser light scattering method.

The average degree of association of the abrasive grains, obtained by dividing the value of the average secondary particle diameter by the value of the average primary particle diameter, is preferably 1.6 or more, and more preferably 1.7 or more. The abrasive grains having a high average degree of association have a peanut shell shape or other odd shape. As the average degree of association of the abrasive grains increases, the polishing rate of the high-mobility material portion and silicon material portion, in particular, the polishing rate of silicon material portion with the polishing composition is enhanced.

The average degree of association of the abrasive grains is also preferably 5 or less, more preferably 4.5 or less, and still more preferably 4 or less. As the average degree of association of the abrasive grains decreases, a polished surface with few scratches is easily obtained by polishing the object with the polishing composition.

(Oxidizing Agent)

The oxidizing agent contained in the polishing composition has a standard electrode potential of 0.3 V or more. When an oxidizing agent having a standard electrode potential of 0.3 V or more is used, the polishing rate of the high-mobility material portion and silicon material portion, in particular, the polishing rate of the high-mobility material portion with the polishing composition is advantageously enhanced as compared with when an oxidizing agent having a standard electrode potential of less than 0.3 V is used. Specific examples of an oxidizing agent having a standard electrode potential of 0.3 V or more include hydrogen peroxide, sodium peroxide, barium peroxide, an organic oxidizing agent, ozone water, a silver (II) salt, an iron (III) salt, permanganic acid, chromic acid, dichromic acid, peroxodisulfuric acid, peroxophosphoric acid, peroxosulfuric acid, peroxoboric acid, performic acid, peracetic acid, perbenzoic acid, perphthalic acid, hypochlorous acid, hypobromous acid, hypoiodous acid, chloric acid, chlorous acid, perchloric acid, bromic acid, iodic acid, periodic acid, sulfuric acid, persulfuric acid, citric acid, dichloroisocyanuric acid, and salts thereof. Among them, hydrogen peroxide, ammonium persulfate, periodic acid, hypochlorous acid, and sodium dichloroisocyanurate are preferable since the polishing rate of the high-mobility material portion and silicon material portion, in particular, the polishing rate of the high-mobility material portion with the polishing composition is greatly enhanced.

The standard electrode potential is represented by the following formula when all chemical species participating in an oxidation reaction are in a normal state:

$$E0 = -\Delta G0/nF = (RT/nF)\ln K$$

where $E0$ is a standard electrode potential; $\Delta G0$ is standard Gibbs energy change of the oxidation reaction, $K$ is an equilibrium constant thereof, $F$ is a Faraday constant, $T$ is an absolute temperature, and $n$ is the number of electrons participating in the oxidation reaction. Therefore, since the standard electrode potential fluctuates with a temperature, a standard electrode potential at 25° C. is utilized in the present specification. The standard electrode potential of an aqueous solution system is described in, for example, Handbook of Chemistry (fundamental part) II, revised 4th edition, pp. 464-468 (edited by the Chemical Society of Japan).

The content of the oxidizing agent in the polishing composition is preferably 0.01 mol/L or more, and more preferably 0.1 mol/L or more. As the oxidizing agent content increases, the polishing rate of the high-mobility material portion with the polishing composition is enhanced.

The content of the oxidizing agent in the polishing composition is also preferably 100 mol/L or less, and more preferably 50 mol/L or less. As the oxidizing agent content decreases, the material cost of the polishing composition can be reduced, and additionally, the burden of treating the polishing composition after use in polishing, that is, the burden of waste liquid treatment can be reduced.

(pH Adjusting Agent)

The value of the pH of the polishing composition needs to be in the range of 1 or more and 6 or less, or 8 or more and 14 or less. When the pH is about 7, there is a disadvantage of substantially reducing the polishing rate of the silicon material portion with the polishing composition.

A pH adjusting agent is used as required in order to adjust the pH of the polishing composition to the range of 1 or more and 6 or less, or 8 or more and 14 or less, and may be any of an acid and an alkali. The pH adjusting agent may be any of inorganic and organic compounds.

According to the present embodiment, the following advantages are obtained.

Odd-shaped abrasive grains are used in the polishing composition of the present embodiment in order to enhance the polishing rate of the high-mobility material portion and silicon material portion, in particular, the polishing rate of the silicon material portion with the polishing composition. An oxidizing agent having a standard electrode potential of 0.3 V or more is also used in order to enhance the polishing rate of the high-mobility material portion with the polishing composition. Further, the polishing rate of the silicon material portion with the polishing composition is kept at a high level by adjusting the pH of the polishing composition to be in the range of 1 or more and 6 or less, or 8 or more and 14 or less. Using the polishing composition thus enables both the high-mobility material portion and the silicon material portion to be polished at a high polishing rate. Accordingly, the polishing composition of the present embodiment is suitably used for the purpose of simultaneously polishing the high-mobility material portion and the silicon material portion.

The embodiment described above may be modified as follows.

The polishing composition of the embodiment described above may contain two or more types of abrasive grains. In such cases, part of the abrasive grains does not need to necessarily have an odd shape.

The polishing composition of the embodiment described above may contain two or more types of oxidizing agent. In such cases, part of the oxidizing agents does not need to necessarily have a standard electrode potential of 0.3 V or more.

The polishing composition of the embodiment described above may further contain a salt. The salt serves to make the electric double layer on the surface of each of the abrasive grains smaller. As a result, electric repulsion between the abrasive grains and the silicon material portion is decreased. Therefore, the polishing composition containing the salt enables the polishing rate of the silicon material portion with the polishing composition to be increased. Although the type of the salt to be used is not particularly limited, the salt is preferably an ammonium salt, such as ammonium sulfate. Using the ammonium salt prevents the polishing composition from being contaminated with metal impurities.

The polishing composition of the embodiment described above may further contain a known additive such as a preservative agent as required.

The polishing composition of the embodiment described above may be of a one-pack type or may be of a multi-pack type, such as a two-pack type.

The polishing composition of the embodiment described above may be prepared by diluting an undiluted solution of the polishing composition with water.

Next, examples of the present invention and comparative examples will be described.

Examples 101 to 113 and Comparative Examples 101 to 110

Polishing compositions of Examples 101 to 113 and Comparative Examples 101 to 108 were prepared by mixing colloidal silica and an oxidizing agent, and a salt and a pH adjusting agent as required, with water. Polishing compositions of Comparative Examples 109 and 110 were prepared by mixing an oxidizing agent with water. The details of the components in each of the polishing compositions and the results obtained by measuring the pH of each polishing composition are shown in Table 1.

TABLE 1

| | Colloidal silica | | | | | | | | Oxidizing agent | | | Salt | | pH |
|---|---|---|---|---|---|---|---|---|---|---|---|---|---|---|
| | Primary particle diameter [nm] | Secondary particle diameter [nm] | Average degree of association | Presence or absence of protrusion | Average width of protrusions [nm] | Average height of protrusions [nm] | Average of heights of protrusions/widths of protrusions | Content [% by mass] | Type | Standard electrode potential [V] | Content [mol/L] | Type | Content [mol/L] | |
| Example 101 | 33.3 | 64.3 | 1.93 | Absence | 0 | 0 | 0 | 1 | $H_2O_2$ | 1.7 | 0.2 | — | — | 4 |
| Example 102 | 33.3 | 64.3 | 1.93 | Absence | 0 | 0 | 0 | 1 | $H_2O_2$ | 1.7 | 0.2 | — | — | 11 |
| Example 103 | 33.3 | 64.3 | 1.93 | Absence | 0 | 0 | 0 | 1 | $H_2O_2$ | 1.7 | 0.2 | Ammonium sulfate | 0.05 | 4 |
| Example 104 | 33.3 | 64.3 | 1.93 | Absence | 0 | 0 | 0 | 1 | APS | 2 | 0.2 | — | — | 4 |
| Example 105 | 33.3 | 64.3 | 1.93 | Absence | 0 | 0 | 0 | 1 | APS | 2 | 0.2 | — | — | 11 |
| Example 106 | 33.3 | 64.3 | 1.93 | Absence | 0 | 0 | 0 | 1 | Sodium dichloroisocyanurate | 1.6 | 0.2 | — | — | 11 |
| Example 107 | 33.3 | 64.3 | 1.93 | Absence | 0 | 0 | 0 | 1 | Periodic acid | 1.6 | 0.2 | — | — | 3 |
| Example 108 | 33.3 | 64.3 | 1.93 | Absence | 0 | 0 | 0 | 1 | Periodic acid | 1.6 | 0.2 | — | — | 10 |
| Example 109 | 33.3 | 64.3 | 1.93 | Absence | 0 | 0 | 0 | 1 | Hypochlorous acid | 0.8 | 0.2 | — | — | 3 |
| Example 110 | 33.3 | 64.3 | 1.93 | Absence | 0 | 0 | 0 | 1 | Hypochlorous acid | 0.8 | 0.2 | — | — | 10 |
| Example 111 | 30.6 | 58.2 | 1.90 | Presence | 16.6 | 5.6 | 0.34 | 1 | $H_2O_2$ | 1.7 | 0.2 | — | — | 11 |
| Example 112 | 30.6 | 58.2 | 1.90 | Presence | 16.6 | 5.6 | 0.34 | 6 | $H_2O_2$ | 1.7 | 0.2 | — | — | 11 |
| Example 113 | 30.6 | 58.2 | 1.90 | Presence | 16.6 | 5.6 | 0.34 | 12 | $H_2O_2$ | 1.7 | 0.2 | — | — | 11 |
| Comparative Example 101 | 33.3 | 64.3 | 1.93 | Absence | 0 | 0 | 0 | 1 | $H_2O_2$ | 1.7 | 0.2 | — | — | 7 |
| Comparative Example 102 | 33.3 | 64.3 | 1.93 | Absence | 0 | 0 | 0 | 1 | APS | 2 | 0.2 | — | — | 7 |
| Comparative Example 103 | 33.3 | 64.3 | 1.93 | Absence | 0 | 0 | 0 | 1 | Sodium dichloroisocyanurate | 1.6 | 0.2 | — | — | 7 |
| Comparative Example 104 | 33.3 | 64.3 | 1.93 | Absence | 0 | 0 | 0 | 1 | Periodic acid | 1.6 | 0.2 | — | — | 7 |
| Comparative Example 105 | 33.3 | 64.3 | 1.93 | Absence | 0 | 0 | 0 | 1 | Hypochlorous acid | 0.8 | 0.2 | — | — | 4 |
| Comparative Example 106 | 33.3 | 64.3 | 1.93 | Absence | 0 | 0 | 0 | 1 | Copper nitrate | 0.2 | 0.2 | — | — | 11 |
| Comparative Example 107 | 25 | 39.3 | 1.57 | Absence | 0 | 0 | 0 | 1 | $H_2O_2$ | 1.7 | 0.2 | — | — | 11 |
| Comparative Example 108 | 30.6 | 58.2 | 1.90 | Presence | 16.6 | 5.6 | 0.34 | 12 | — | — | — | — | — | 11 |
| Comparative Example 109 | — | — | — | — | — | — | — | — | $H_2O_2$ | 1.7 | 0.2 | — | — | 11 |
| Comparative Example 110 | — | — | — | — | — | — | — | — | Sodium dichloroisocyanurate | 1.6 | 0.2 | — | — | 8 |

In Table 1, "H₂O₂" represents hydrogen peroxide, and "APS" represents ammonium persulfate. Acetic acid or potassium hydroxide was used as the pH adjusting agent.

The values of polishing rates obtained when the surfaces of a silicon germanium blanket wafer, germanium blanket wafer, and tetraethyl orthosilicate (TEOS) blanket wafer are polished under the conditions shown in Table 2 with each of the polishing compositions of Examples 101 to 113 and Comparative Examples 101 to 110 are shown in the columns entitled "polishing rate of SiGe", "polishing rate of Ge", and "polishing rate of TEOS", respectively, of Table 3. The value of the polishing rate of the TEOS blanket wafer was obtained by dividing by polishing time the difference between the thicknesses of the wafer before and after polishing measured using an optical interferometric film thickness measurement apparatus. The value of the polishing rate of the silicon germanium blanket wafer and the value of the polishing rate of the germanium wafer were obtained by dividing by the density and polishing time the difference between the weights of each of the wafers before and after polishing. The value obtained by dividing the thus obtained polishing rate of silicon germanium with each of the polishing compositions of Examples 101 to 113 and Comparative Examples 101 to 110 by the thus obtained polishing rate of TEOS with the same polishing composition is shown in the column entitled "polishing rate of SiGe/ polishing rate of TEOS" of Table 3. The value obtained by dividing the thus obtained polishing rate of germanium with each polishing composition by the thus obtained polishing rate of TEOS with the same polishing composition is shown in the column entitled "polishing rate of Ge/polishing rate of TEOS" of Table 3.

The acceptable level of the polishing rate of silicon germanium is 300 Å/min or more, more preferably 500 Å/min or more, and still more preferably 700 Å/min or more. The acceptable level of the polishing rate of germanium is 600 Å/min or more, more preferably 1,000 Å/min or more, and still more preferably 1,400 Å/min or more. The acceptable level of the polishing rate of TEOS is 100 Å/min or more, more preferably 200 Å/min or more, and still more preferably 300 Å/min or more. The acceptable level of the value obtained by dividing the polishing rate of silicon germanium by the polishing rate of TEOS is 30 or less, more preferably 20 or less, and still more preferably 10 or less. The acceptable level of the value obtained by dividing the polishing rate of silicon germanium by the polishing rate of TEOS is 60 or less, more preferably 40 or less, and still more preferably 20 or less.

TABLE 2

Apparatus: One-side CMP polisher
Polishing pad: Politex (trade name) manufactured by Rodel Incorporated
Polishing pressure: 100 g/cm²
Rotational speed of platen: 50 rpm
Feeding rate of polishing composition: 100 mL/min

TABLE 3

| | Polishing rate of SiGe [Å/min] | Polishing rate of Ge [Å/min] | Polishing rate of TEOS [Å/min] | Polishing rate of SiGe/ polishing rate of TEOS | Polishing rate of Ge/ polishing rate of TEOS |
|---|---|---|---|---|---|
| Example 101 | 800 | 1440 | 216 | 3.7 | 6.7 |
| Example 102 | 450 | 810 | 258 | 1.7 | 3.1 |
| Example 103 | 810 | 1458 | 278 | 2.9 | 5.2 |
| Example 104 | 500 | 900 | 210 | 2.4 | 4.3 |
| Example 105 | 800 | 1440 | 417 | 1.9 | 3.5 |
| Example 106 | 600 | 1080 | 405 | 1.5 | 2.7 |
| Example 107 | 700 | 1260 | 318 | 2.2 | 4.0 |
| Example 108 | 450 | 810 | 322 | 1.4 | 2.5 |
| Example 109 | 1600 | 2880 | 312 | 5.1 | 9.2 |
| Example 110 | 800 | 1440 | 314 | 2.5 | 4.6 |
| Example 111 | 450 | 810 | 739 | 0.6 | 1.1 |
| Example 112 | 450 | 810 | 910 | 0.5 | 0.9 |
| Example 113 | 450 | 810 | 1117 | 0.4 | 0.7 |
| Comparative Example 101 | 700 | 1260 | 85 | 8.2 | 14.8 |
| Comparative Example 102 | 800 | 1440 | 77 | 10.4 | 18.7 |
| Comparative Example 103 | 550 | 990 | 92 | 6.0 | 10.8 |
| Comparative Example 104 | 500 | 890 | 87 | 5.7 | 10.3 |
| Comparative Example 105 | 1100 | 1980 | 78 | 14.1 | 25.4 |
| Comparative Example 106 | 500 | 890 | 56 | 8.9 | 16.1 |
| Comparative Example 107 | 680 | 1224 | 91 | 7.5 | 13.5 |
| Comparative Example 108 | 56 | 87 | 240 | 0.2 | 0.4 |
| Comparative Example 109 | 400 | 720 | 15 | 26.7 | 48.0 |
| Comparative Example 110 | 400 | 720 | 11 | 36.4 | 65.5 |

As shown in Table 3, in the case of the polishing compositions of Examples 101 to 113, the polishing rate of silicon germanium was 300 Å/min or more, or the polishing rate of germanium was 600 Å/min or more and the polishing rate of TEOS was 100 Å/min or more. These obtained results are at a level which can be satisfactorily used for the purpose of simultaneously polishing the high-mobility material portion and the silicon material portion.

On the other hand, in the case of the polishing compositions of Comparative Examples 101 to 110, the polishing rate of silicon germanium or germanium, or the polishing rate of TEOS was below the acceptable level. These obtained results are not at a level which can be satisfactorily used for the purpose of simultaneously polishing the high-mobility material portion and the silicon material portion.

Examples 201 to 209 and Comparative Examples 201 to 206

Polishing compositions of Examples 201 to 209 and Comparative Examples 201 to 205 were prepared by mixing colloidal silica and an oxidizing agent, and a salt and a pH adjusting agent as required, with water. A polishing composition of Comparative Example 206 was prepared by mixing an oxidizing agent with water. The details of the components in each of the polishing compositions and the results obtained by measuring the pH of each polishing composition are shown in Table 4.

TABLE 4

| | Colloidal silica | | | | | | |
|---|---|---|---|---|---|---|---|
| | Primary particle diameter [nm] | Secondary particle diameter [nm] | Average degree of association | Presence or absence of protrusion | Average width of protrusions [nm] | Average height of protrusions [nm] | Average of heights of protrusions/ widths of protrusions |
| Example 201 | 33.3 | 64.3 | 1.93 | Absence | 0 | 0 | 0 |
| Example 202 | 33.3 | 64.3 | 1.93 | Absence | 0 | 0 | 0 |
| Example 203 | 33.3 | 64.3 | 1.93 | Absence | 0 | 0 | 0 |
| Example 204 | 33.3 | 64.3 | 1.93 | Absence | 0 | 0 | 0 |
| Example 205 | 33.3 | 64.3 | 1.93 | Absence | 0 | 0 | 0 |
| Example 206 | 33.3 | 64.3 | 1.93 | Absence | 0 | 0 | 0 |
| Example 207 | 30.6 | 58.2 | 1.90 | Presence | 16.6 | 5.6 | 0.34 |
| Example 208 | 30.6 | 58.2 | 1.90 | Presence | 16.6 | 5.6 | 0.34 |
| Example 209 | 30.6 | 58.2 | 1.90 | Presence | 16.6 | 5.6 | 0.34 |
| Comparative Example 201 | 33.3 | 64.3 | 1.93 | Absence | 0 | 0 | 0 |
| Comparative Example 202 | 33.3 | 64.3 | 1.93 | Absence | 0 | 0 | 0 |
| Comparative Example 203 | 33.3 | 64.3 | 1.93 | Absence | 0 | 0 | 0 |
| Comparative Example 204 | 33.3 | 64.3 | 1.93 | Absence | 0 | 0 | 0 |
| Comparative Example 205 | 25 | 39.3 | 1.57 | Absence | 0 | 0 | 0 |
| Comparative Example 206 | — | — | — | — | — | — | — |

| | Colloidal silica Content [% by mass] | Oxidizing agent | | | Salt | | Type of pH adjusting agent | pH |
|---|---|---|---|---|---|---|---|---|
| | | Type | Standard electrode potential [V] | Content [mol/L] | Type | Content [mol/L] | | |
| Example 201 | 1 | $H_2O_2$ | 1.7 | 0.2 | — | — | Acetic acid | 4 |
| Example 202 | 1 | $H_2O_2$ | 1.7 | 0.2 | — | — | KOH | 11 |
| Example 203 | 1 | $H_2O_2$ | 1.7 | 0.2 | Ammonium sulfate | 0.05 | Acetic acid | 4 |
| Example 204 | 1 | APS | 2 | 0.2 | — | — | Acetic acid | 4 |
| Example 205 | 1 | APS | 2 | 0.2 | — | — | KOH | 11 |
| Example 206 | 1 | Sodium dichloro-isocyanurate | 1.6 | 0.2 | — | — | KOH | 11 |
| Example 207 | 1 | $H_2O_2$ | 1.7 | 0.2 | — | — | KOH | 11 |
| Example 208 | 6 | $H_2O_2$ | 1.7 | 0.2 | — | — | KOH | 11 |
| Example 209 | 12 | $H_2O_2$ | 1.7 | 0.2 | — | — | KOH | 11 |
| Comparative Example 201 | 1 | $H_2O_2$ | 1.7 | 0.2 | — | — | — | 7 |
| Comparative Example 202 | 1 | APS | 2 | 0.2 | — | — | — | 7 |
| Comparative Example 203 | 1 | Sodium dichloro-isocyanurate | 1.6 | 0.2 | — | — | — | 7 |
| Comparative Example 204 | 1 | Copper nitrate | 0.2 | 0.2 | — | — | Acetic acid | 4 |
| Comparative Example 205 | 1 | $H_2O_2$ | 1.7 | 0.2 | — | — | KOH | 11 |

TABLE 4-continued

| | | | | | | | |
|---|---|---|---|---|---|---|---|
| Comparative Example 206 | — | Sodium dichloro-isocyanurate | 1.6 | 0.2 | — | — — | 8 |

In Table 4, "$H_2O_2$" represents hydrogen peroxide, "APS" represents ammonium persulfate, and "KOH" represents potassium hydroxide.

The values of polishing rates obtained when the surfaces of a gallium arsenide blanket wafer and tetraethyl orthosilicate (TEOS) blanket wafer are polished under the conditions shown in Table 5 with each of the polishing compositions of Examples 201 to 209 and Comparative Examples 201 to 206 are shown in the columns entitled "polishing rate of GaAs" and "polishing rate of TEOS", respectively, of Table 6. The value of the polishing rate of the TEOS blanket wafer was obtained by dividing by polishing time the difference between the thicknesses of the wafer before and after polishing measured using an optical interferometric film thickness measurement apparatus. The value of the polishing rate of the gallium arsenide blanket wafer was obtained by dividing by the density and polishing time the difference between the weights of the wafer before and after polishing. The value obtained by dividing the thus obtained polishing rate of gallium arsenide with each of the polishing compositions of Examples 201 to 209 and Comparative Examples 201 to 206 by the thus obtained polishing rate of TEOS with the same polishing composition is shown in the column entitled "polishing rate of GaAs/polishing rate of TEOS" of Table 6.

The acceptable level of the polishing rate of gallium arsenide is 500 Å/min or more, more preferably 600 Å/min or more, and still more preferably 700 Å/min or more. The acceptable level of the polishing rate of TEOS is 100 Å/min or more, more preferably 200 Å/min or more, and still more preferably 300 Å/min or more. The acceptable level of the value obtained by dividing the polishing rate of gallium arsenide by the polishing rate of TEOS is 30 or less, more preferably 20 or less, and still more preferably 10 or less.

TABLE 5

Apparatus: One-side CMP polisher
Polishing pad: Politex (trade name) manufactured by Rodel Incorporated
Polishing pressure: 100 g/cm$^2$
Rotational speed of platen: 50 rpm
Feeding rate of polishing composition: 100 mL/min

TABLE 6

| | Polishing rate of GaAs [Å/min] | Polishing rate of TEOS [Å/min] | Polishing rate of GaAs/ polishing rate of TEOS |
|---|---|---|---|
| Example 201 | 954 | 196 | 5 |
| Example 202 | 4134 | 258 | 16 |
| Example 203 | 1011 | 278 | 4 |
| Example 204 | 2126 | 189 | 11 |
| Example 205 | 978 | 417 | 2 |
| Example 206 | 12786 | 405 | 32 |
| Example 207 | 4352 | 739 | 6 |
| Example 208 | 4541 | 910 | 5 |
| Example 209 | 4641 | 1117 | 4 |
| Comparative Example 201 | 697 | 85 | 8 |
| Comparative Example 202 | 1563 | 77 | 20 |
| Comparative Example 203 | 11818 | 92 | 128 |
| Comparative Example 204 | 200 | 206 | 1 |
| Comparative Example 205 | 3911 | 91 | 43 |
| Comparative Example 206 | 2955 | 11 | 269 |

As shown in Table 6, in the case of the polishing compositions of Examples 201 to 209, the polishing rate of gallium arsenide was 500 Å/min or more, and the polishing rate of TEOS was 100 Å/min or more. These obtained results are at a level which can be satisfactorily used for the purpose of simultaneously polishing the high-mobility material portion and the silicon material portion.

On the other hand, in the case of the polishing compositions of Comparative Examples 201 to 206, the polishing rate of gallium arsenide or the polishing rate of TEOS was below the acceptable level. These obtained results are not at a level which can be satisfactorily used for the purpose of simultaneously polishing the high-mobility material portion and the silicon material portion.

The invention claimed is:

1. A polishing composition comprising non-spherical shaped abrasive grains, an oxidizing agent having a standard electrode potential of 0.3 V or more, and a salt, the abrasive grains having an average secondary particle diameter of 300 nm or less, wherein the polishing composition has a pH of 1 or more and 6 or less, or 8 or more and 14 or less, and wherein the abrasive grains contain particles each having a surface with a plurality of protrusions, wherein each protrusion forms a convex portion extending out from a maximum inscribed circle in the abrasive grain particle, wherein length of the protrusion does not exceed one-fourth of the circumferential length of the maximum inscribed circle, the curve extending from a base portion of a protrusion to the opposite base portion of the protrusion and passing through a point on the protrusion furthest from the base portion, and
the base portion having a width, which is a longest straight line distance between two points on the base portion of the protrusion, and the protrusion having a height, which is a distance between the base portion and a surface of the protrusion furthest from the base portion that is orthogonal to the base portion, the particles have a volume average particle diameter and include large particles that each have a particle diameter larger than the volume average particle diameter, an average of values respectively obtained by dividing the height of a protrusion on the surface of each of the large particles by the width of the base portion of the same protrusion is 0.245 or more.

2. The polishing composition according to claim 1, wherein the abrasive grains have an average degree of association, obtained by dividing an average secondary particle diameter value of the abrasive grains by an average primary particle diameter value of the abrasive grains, is 1.6 or more.

3. The polishing composition according to claim 1, wherein protrusions on surfaces of particles which belong to the part of the particles each having the surface with the plurality of protrusions and have larger particle diameters than the volume average particle diameter of the particles have an average height of 2.5 nm or more.

4. The polishing composition according to claim 1, wherein the salt is an ammonium salt.

5. The polishing composition according to claim 1, wherein the average secondary particle diameter of the abrasive grains is 250 nm or less.

6. The polishing composition according to claim 1, wherein the pH of the polishing composition is 1 or more and 6 or less.

7. The polishing composition according to claim 1, wherein the oxidizing agent is hydrogen peroxide, ammonium persulfate, periodic acid, or hypochlorous acid.

8. The polishing composition according to claim 1, wherein the pH of the polishing composition is 8 or more and 14 or less.

9. The polishing composition according to claim 1, wherein the oxidizing agent is ammonium persulfate, sodium dichloroisocyanurate, hypochlorous acid, or periodic acid.

10. A method for polishing, comprising:
   providing an object including a portion containing a group IV material or a group III-V compound and a portion containing a silicon material; and
   using the polishing composition according to claim 1 to polish the object.

11. The method according to claim 10, wherein the abrasive grains have an average degree of association, obtained by dividing an average secondary particle diameter value of the abrasive grains by an average primary particle diameter value of the abrasive grains, is 1.6 or more.

12. The method according to claim 10, wherein protrusions on surfaces of particles which belong to the part of the particles each having the surface with the plurality of protrusions and have larger particle diameters than the volume average particle diameter of the particles have an average height of 2.5 nm or more.

13. The method according to claim 10, wherein the salt is an ammonium salt.

14. A method for producing a substrate, comprising:
   providing an object including a portion containing group IV material or a group III-V compound and a portion containing a silicon material; and
   using the polishing composition according to claim 1 to produce a substrate by polishing the object.

15. The method according to claim 14, wherein the abrasive grains have an average degree of association, obtained by dividing an average secondary particle diameter value of the abrasive grains by an average primary particle diameter value of the abrasive grains, is 1.6 or more.

16. The method according to claim 14, wherein protrusions on surfaces of particles which belong to the part of the particles each having the surface with the plurality of protrusions and have larger particle diameters than the volume average particle diameter of the particles have an average height of 2.5 nm or more.

17. The method according to claim 14, wherein the salt is an ammonium salt.

* * * * *